(12) United States Patent
Lee et al.

(10) Patent No.: US 6,830,941 B1
(45) Date of Patent: Dec. 14, 2004

(54) METHOD AND APPARATUS FOR IDENTIFYING INDIVIDUAL DIE DURING FAILURE ANALYSIS

(75) Inventors: Chern-Jiann Lee, Los Altos, CA (US);
Boon Y. Ang, Cupertino, CA (US);
David Lin, Sunnyvale, CA (US);
Mehrdad Mahanpour, Union City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 25 days.

(21) Appl. No.: 10/321,000

(22) Filed: Dec. 17, 2002

(51) Int. Cl.$^7$ ............................................... H01L 21/66
(52) U.S. Cl. ........................................................ 438/14
(58) Field of Search ............................ 438/14, 15, 16

(56) References Cited

U.S. PATENT DOCUMENTS

| | | | | |
|---|---|---|---|---|
| 6,087,845 A | * | 7/2000 | Wood et al. ................. | 324/765 |
| 6,365,421 B2 | * | 4/2002 | Debenham et al. ........... | 438/14 |
| 6,625,497 B2 | * | 9/2003 | Fairbairn et al. ............. | 700/1 |
| 6,640,151 B1 | * | 10/2003 | Somekh et al. ............. | 700/121 |
| 6,645,684 B2 | * | 11/2003 | Atkinson et al. ............. | 430/30 |
| 6,710,284 B1 | * | 3/2004 | Farnworth et al. ..... | 219/121.68 |
| 6,727,106 B1 | * | 4/2004 | Ankutse et al. ................ | 438/5 |

* cited by examiner

*Primary Examiner*—John F. Niebling
*Assistant Examiner*—Olivia Luk
(74) *Attorney, Agent, or Firm*—Winstead Sechrest & Minick P.C.

(57) ABSTRACT

A method and apparatus for identifying individual semiconductor die that originate from a semiconductor substrate containing a plurality of die is disclosed. Aspects of the invention include physically associating a respective die ID with at least a portion of individual die on the wafer, and storing the die ID and wafer fabrication information in a database. During subsequent testing of the die, the die ID is used to retrieve the wafer fabrication information from the database, thereby aiding a determination as to a cause of a failure of the die.

3 Claims, 2 Drawing Sheets

METHOD AND APPARATUS FOR IDENTIFYING INDIVIDUAL DIE DURING FAILURE ANALYSIS

FIELD OF THE INVENTION

The present invention relates to semiconductor process failure analysis, and more particularly to a method and apparatus for identifying individual die during failure analysis.

BACKGROUND OF THE INVENTION

A semiconductor wafer is the base material used in chip making, which goes through a series of photomasking, etching, and implantation steps to produce die or chips containing integrated circuits. Individual wafers are sliced from a cylindrical silicon crystal that is generally 8 to 12 inches in diameter.

The wafers sliced from the crystal as a lot (e.g., 25 wafers) and are assigned a wafer lot number or ID. The wafer lot ID is then typically scribed on the surface of each wafer. In addition to, or as an alternative to the lot ID, each wafer may also be assigned a wafer ID. For tracking purposes, the lot ID and/or the wafer ID may be stored in a work stream database along with the materials, suppliers, vendors, and process history including specifications, recipes, equipments, operators and times used to manufacture the wafer and/or the wafer lot.

After the chip making process, a single wafer may contain hundreds or even thousands of die. Each die is cut out of the wafer and then packaged. During packaging, die from different wafers may be assembled at the same batch of the jobs and then box stocked together. Normally, it is of little concern which wafer a die originated from.

But for technology qualification and failure analysis testing, it is important to track the history of the die in order to trace the origins of problems and faults that may develop during fabrication. The problem is that given a package for testing, there is no current method for determining which wafer a given die originated from and from which die location, usually represented by die x/y coordinates, of that wafer. In addition, the lot ID and/or the wafer ID is also lost when the die are cut from the wafer.

Accordingly, what is needed is a method for tying each die to the history of materials and processes associated with the originating wafer. The present invention addresses such a need.

SUMMARY OF THE INVENTION

The present invention provides a method and apparatus for identifying individual semiconductor die that originate from a semiconductor substrate containing a plurality of die. Aspects of the invention include physically associating a respective die ID with at least a portion of individual die on the wafer, and storing the die ID and wafer fabrication information in a database. During subsequent testing of the die, the die ID is used to retrieve the wafer fabrication information from the database, thereby aiding a determination as to a cause of a failure of the die.

DETAILED DESCRIPTION

The present invention relates to semiconductor die identification. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
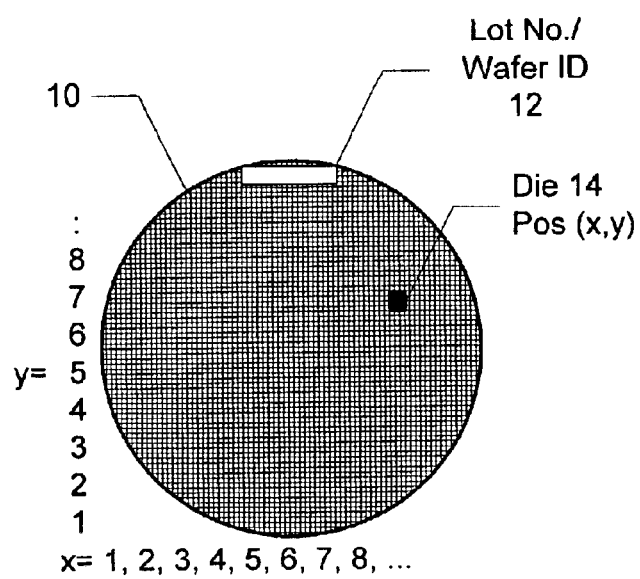
FIG. 1 is a block diagram showing a standard semiconductor wafer.

FIG. 1 is a block diagram showing a standard semiconductor wafer. The wafer 10 is typically provided with a lot number and/or a wafer ID 12, which are typically stored in a database for tracking purposes. Individual die 14 containing integrated circuits are built on the wafer 10 using various fabrication techniques. Each die 14 includes a series of pads (not shown) along the periphery of the die 14 for subsequent communication with external circuits. Depending on the size of the wafer 10, and the size of the die 14, the wafer 10 may include hundreds or thousands of die 14.

In order to verify operation of the die 14, some or all of the die 14 may be tested during a wafer sort operation. The wafer sort process utilizes a tester apparatus and a probing station. The tester is a fixed apparatus on which the wafer 10 is fixed, and includes a probe card that connects to the pads of the die 14 during testing. A test program controls the actual test through the probe card. The function of the probing station is to move the wafer 10 in relation to the probe card, such that the die 14 are sequentially placed under the probe card for testing at the request of the test program. A probing map that contains the physical location of each die 14 on the wafer 10 controls the geometrical movement of the probing station. Typically, the physical location of the die 14 is represented in the probing map as x, y coordinate values, as shown in FIG. 1.

After the wafer sort operation, the die 14 on the wafer 10 are separated from one another by cutting wafer 10 along boundaries defining the die 14. The die 14 that pass the wafer sort test are then packaged. After packaging, package-level test are performed to determine the functionality of the package.

During package testing, a particular die 14 package may fail, but because the lot number and wafer ID 12 of the wafer 10 is lost when the die 14 are cut from the wafer 10, there's no way to track the die back to the wafer 10 in an effort to help determine the cause of the failure. One possibility is code some ID information coded on a photo mask. However, since the mask will be repeatedly used on the wafer and also used on different wafers, the die on the wafer 10 would have the same ID information, and there would be no way to differentiate each die 14 during testing.

Figure 2:
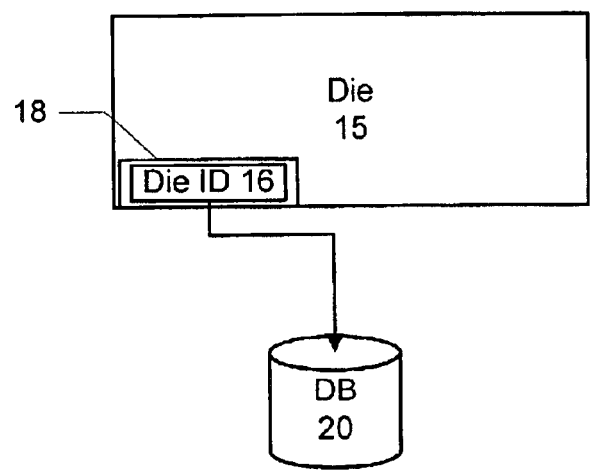
FIG. 2 is a block diagram illustrating a sample die that has been modified in accordance with the present invention.

The present invention provides a method and apparatus for tracking individual die 15. FIG. 2 is a block diagram illustrating a sample die that has been modified in accordance with the present invention. According to the present invention, a respective die ID 16 is physically associated with each die 15 in the wafer 10, and the die ID 16 and wafer fabrication information are stored in a database 20, such as the work stream database. Thereafter, the die 15 are sliced from the wafer 10 and packaged. During testing of the packages, if a problem is found with a particular die 15, then in accordance with present invention, the die ID 16 associated with the bad die 15 may be used as an index to the database 20 to determine the fabrication history of the die 15.

Figure 3:
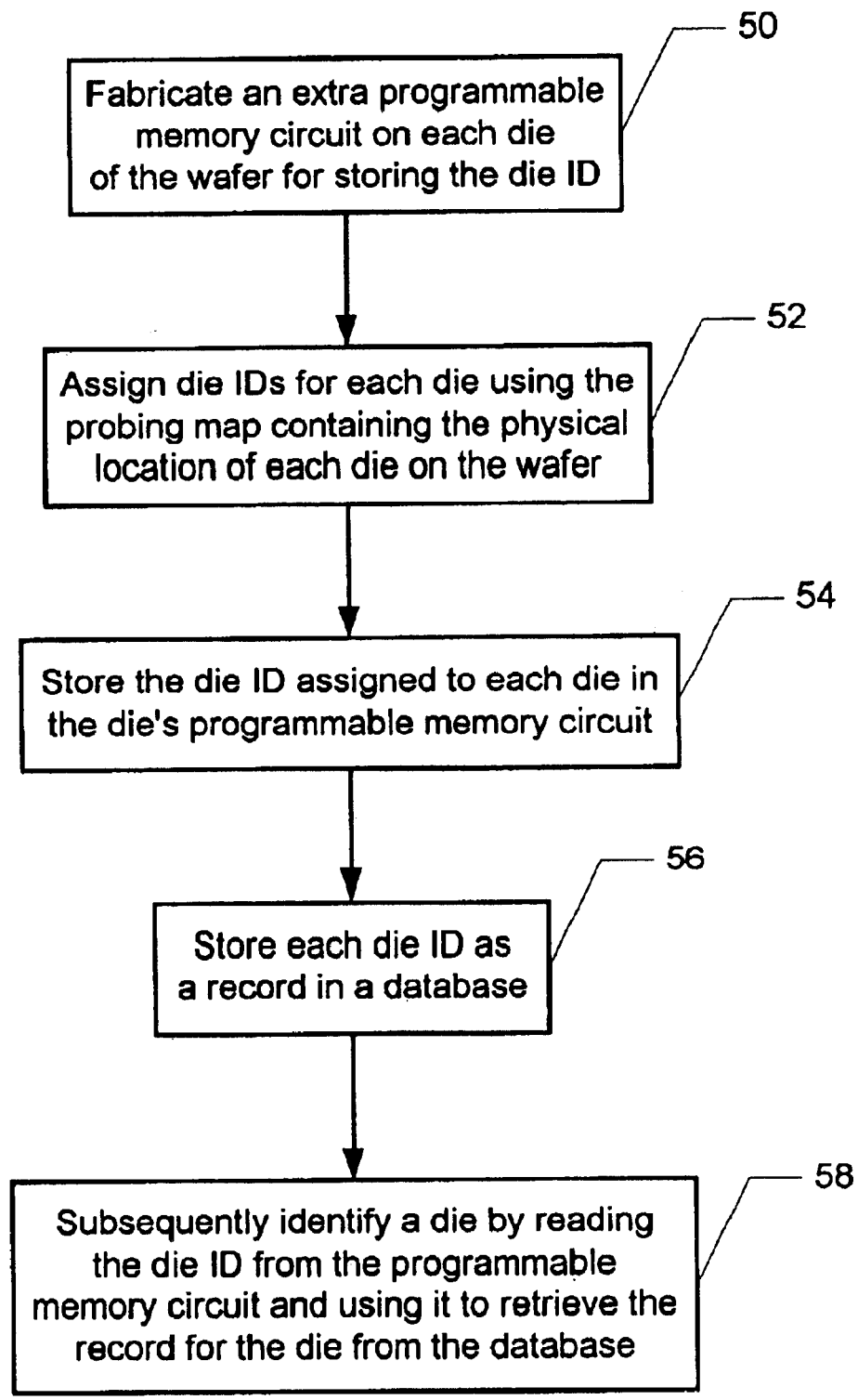
FIG. 3 is a flow chart illustrating a process for identifying individual die for failure analysis in accordance with a preferred embodiment of the present invention.

Referring now to FIG. 3, a flow chart is shown illustrating a process for identifying individual die 15 for failure analysis in accordance with a preferred embodiment of the present invention. The process begins in step 50 by fabricating an extra programmable memory circuit 18 on each die 15 of the wafer 10 for storing the die ID 16, as shown in FIG. 2. In a preferred embodiment, the type of programmable memory circuit 18 built into each die 15 depends on the type of circuits the die contains. If, for example, the die 15 contains primarily flash memory circuits, then the programmable memory circuit 18 is also fabricated as a flash memory circuit. If the die 15 contains primarily logic circuits, however, then the programmable memory circuit 18 may be fabricated as a one-time programmable memory circuit 18. The programmable memory circuit 18 needs to be no larger than several bytes in size, and only occupies a small, otherwise blank area of the die 15.

In step 52, the probing map containing the physical location of each die 15 on the wafer 10 is used to assign a die ID 16 to each die 15. In a preferred embodiment, each die ID 16 may include the x, y coordinates of the respective die 15 as indicated in the probing map, a product ID, the lot ID, and the wafer ID 12. The die ID 16 further include bin information indicating in which bin the particular die 15 will be stored after testing.

In step 54, the die ID 16 assigned to each die 15 is then stored in the die's programmable memory circuit 18. In a preferred embodiment, the die ID 16 is stored in a particular die's programmable memory circuit 18 during the wafer sort operation. That is, when each wafer 10 is positioned beneath the probe card for testing, the test program is written such that it instructs the test system electronics to write the die ID 16 assigned to each die 15 into the programmable memory circuit 18 of the die 15 at the end of testing prior to moving on to the next die 15.

In step 56, each die ID 16 may be stored as a record in a database 20, such as the work stream database. As stated above, the lot ID and wafer ID 12 of the originating wafer 10 may also be stored in the work stream database to identify the materials, vendors, and processes history information used to create a wafer 10.

In step 58, after the die 15 are sliced from the wafer 10 and packaged, each die 15 may be subsequently identified during package testing or other type of failure analysis by reading the die ID 16 from the programmable memory circuit 18 and using it to retrieve the record for the die 15 from the database in order to determine the origins of the die 15. According to the present invention, identifying a die 15 and obtaining the processing characteristics associated with the originating wafer 10 may aid in determining the cause of a failure in the die 15. The present invention can also help in identifying similar die 15 originating from the same wafer, same lot or a specific die location of a certain wafer, lot, if it's determined that such die, wafer or lot may contain a bug or cause reliability concern. The capability of identifying problem die 15 can help in implementing fix or replace procedures.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A semiconductor wafer, comprising
 a wafer lot ID scribed thereon; and
 a plurality of die containing integrated circuits, at least a portion of the die further including a programmable circuit for storing a die ID, wherein when the die ID is read from the programmable memory, the die can be identified in order to track the die's origin.

2. A semiconductor die, comprising
 an integrated circuit; and
 a programmable circuit for storing a die ID, wherein when the die ID is read from the programmable memory, the die can be identified in order to track the die's origin.

3. A semiconductor package, comprising
 a first die from a first wafer; and
 a second die from a second wafer;
 wherein the first and second die include respective programmable circuits for storing respective die ID, such that when the die IDs are read from the respective programmable circuits, each die can be identified in order to determine which wafer the die originated from.

* * * * *